US009829152B2

(12) United States Patent
Spohn et al.

(10) Patent No.: US 9,829,152 B2
(45) Date of Patent: Nov. 28, 2017

(54) CYLINDER PREPARATION FOR MAINTAINING STABILITY OF STORED MATERIALS

(71) Applicants: Ronald F. Spohn, Getzville, NY (US); Ashwini Sinha, East Amherst, NY (US); Carl B. Richenberg, Batavia, NY (US)

(72) Inventors: Ronald F. Spohn, Getzville, NY (US); Ashwini Sinha, East Amherst, NY (US); Carl B. Richenberg, Batavia, NY (US)

(73) Assignee: PRAXAIR TECHNOLOGY, INC., Danbury, CT (US)

( * ) Notice: Subject to any disclaimer, the term of this patent is extended or adjusted under 35 U.S.C. 154(b) by 1147 days.

(21) Appl. No.: 13/918,564

(22) Filed: Jun. 14, 2013

(65) Prior Publication Data
US 2013/0334231 A1   Dec. 19, 2013

Related U.S. Application Data

(60) Provisional application No. 61/660,311, filed on Jun. 15, 2012.

(51) Int. Cl.
*F17C 1/00*   (2006.01)
*C23C 16/448*   (2006.01)

(52) U.S. Cl.
CPC ............ *F17C 1/00* (2013.01); *C23C 16/448* (2013.01); *F17C 2203/0607* (2013.01); *F17C 2209/232* (2013.01); *F17C 2223/0123* (2013.01); *F17C 2270/0518* (2013.01)

(58) Field of Classification Search
None
See application file for complete search history.

(56) References Cited

U.S. PATENT DOCUMENTS

| | | | |
|---|---|---|---|
| 5,479,727 A | 1/1996 | Fine et al. | |
| 5,928,743 A | 7/1999 | Bealky et al. | |
| 2005/0257856 A1 | 11/2005 | Jacksier et al. | |
| 2007/0249778 A1* | 10/2007 | Clemens | C08G 18/10 524/502 |

(Continued)

FOREIGN PATENT DOCUMENTS

| | | |
|---|---|---|
| EP | 0818565 A2 | 1/1998 |
| EP | 2395127 A1 | 12/2011 |
| JP | 2009259973 | 11/2009 |

(Continued)

OTHER PUBLICATIONS

Kettle, S. F. A.. 494. The Kinetics of the Decomposition of Stannane on a Tin Surface. J. Phys. Chem. (1961) pp. 2569-2572.

(Continued)

*Primary Examiner* — Michael Wieczorek
*Assistant Examiner* — Bradford Gates
(74) *Attorney, Agent, or Firm* — Nilay S. Dalal

(57) ABSTRACT

Novel cylinder passivation procedures to increase the room temperature stability of gaseous tin deuteride ($SnD_4$) are described. Incorporation of specific organic-containing materials, which when applied onto surfaces of a vessel and/or conduit extending therefrom, can increase the shelf life stability of thermodynamically unstable gases stored within such pretreated vessels.

8 Claims, 4 Drawing Sheets

(56) References Cited

U.S. PATENT DOCUMENTS

2010/0140175 A1  6/2010  Wyse et al.
2012/0103857 A1* 5/2012  Behm .................. C23C 16/448
                                                      206/524.3

FOREIGN PATENT DOCUMENTS

JP        2009259973 A    11/2009
JP        2012006827 A     1/2012

OTHER PUBLICATIONS

McGovern, Mark E. et al. Role of Solvent on the Silanization of Glass with Octadecyltrichlorosilane. Langmuir 10 (1994), pp. 3607-3614.
Norman, A.D. et al. Silane, Stannane, Silane-$d_4$, Germane-$d_4$ and Stannane-$d_4$, . Inorganic Synthesis 11, 170 (1968).
Spohn, R.F. and Richenburg, C.B.. Tin Deuteride ($SnD_4$) Stabilization. The 222 Electrochemical Society Meeting (ECS), Oct. 7-12, 2012, Honolulu, Hawaii, paper 3220.
Tamaru, Kenzi. The Thermal Decomposition of Tin Hydride. Frick Chemical Laboratory, Princeton University, Princeton, NJ. J. Phys. Chem, vol. 60 (May 1956) pp. 610-612.
Xie, Junqi et al. Synthesis, Stability Range, and Fundamental Properties of Si—Ge—Sn Smiconductors Grown Directly on Si(100) and Ge(100) Platforms. Chemstry of Materials 22 (2010) pp. 3779-3789.

* cited by examiner

CYLINDER PREPARATION FOR MAINTAINING STABILITY OF STORED MATERIALS

RELATED APPLICATIONS

This application claims priority to U.S. provisional application Ser. No. 61/660,311 filed Jun. 15, 2012, the disclosure of which is incorporated by reference herein.

FIELD OF THE INVENTION

The present invention relates to cylinder preparation and passivation for subsequent storage and delivery of gases. In particular, the present invention relates to specific organic-containing materials which when applied onto surfaces of a vessel and/or conduit extending therefrom, increase shelf life stability of thermodynamically unstable gases. The gases may be useful as a source material in semiconductor applications.

BACKGROUND

The use of silicon and its oxide as the basis of microelectronics will soon reach its physical limitations. Investigators have turned to the use of SiGe alloys to improve the performance of basic devices. The incorporation of SiGe strain engineered structures into both nMOS (tensile strain) and pMOS (compressive strain) structures have boosted chip speeds by approximately 20%.

Silicon-Germanium (SiGe) technology is the driving force behind emergence of low-cost, lightweight, personal communications devices such as digital wireless handsets, as well as other entertainment and information technologies such as digital set-top boxes, Direct Broadcast Satellite (DBS), automobile collision avoidance systems, and personal digital assistants. SiGe extends the life of wireless phone batteries, and allows smaller and more durable communication devices. Products combining the capabilities of cellular phones, global positioning, and Internet access in one package, are being designed using SiGe technology. These multifunction, low-cost, mobile client devices capable of communicating over voice and data networks represent a key element of the future of computing.

Although SiGe has been successfully adopted as a compressive strain agent for its ability to improve hole mobility in Si p-MOS channels, it falls short in meeting the objectives of next generation devices. In fact, shrinking of CMOS devices beyond the 15 nm technology node in ~2013 is expected to require the implementation of materials with higher intrinsic channel mobility than Si. Germanium is the leading candidate for pMOS devices, while III/V materials are suitable for nMOS devices. Compressive strain is required in the Ge channel layer for it to outperform state-of-the art uniaxially compressively strained Si.

The limitations of SiGe has prompted the emergence of new materials. The selection of Sn as a new generation Ge—Sn alloy material for this purpose maybe a suitable choice, given the large lattice constant and suitable band gap of Sn. Accordingly, a volatile Sn precursor source material that maintains its chemical stability during storage and delivery and which can be handled safely and reliable is needed.

SnCl4 has been used in the industry as a typically precursor material. Previous studies have indicated that up to 8% Sn incorporation is achievable using $SnCl_4$ as the precursor material. However, the potential for chloride contamination in the final film may make the ability to achieve higher doses difficult. SnCl4 may therefore not be a suitable Sn precursor material for applications where high purity levels are required.

As will be discussed, among other advantages of the present invention, an improved method and storage package for stabilizing high purity Sn-containing precursor materials for use in various applications, such as semiconductor manufacturing, is desired. Other aspects of the present invention will become apparent to one of ordinary skill in the art upon review of the specification, drawings and claims appended hereto.

SUMMARY OF THE INVENTION

The invention may include any of the following aspects in various combinations and may also include any other aspect described below in the written description or in the attached drawings.

In a first aspect, a method of pretreating a vessel to maintain storage of a precursor material in a stabilized form within the vessel, said method comprising providing a pressure vessel and/or conduit extending therefrom having an interior volume defined by one or more surfaces; pretreating the one or more surfaces by applying an organic-containing material onto the one or more surfaces of the vessel and/or conduit; forming a protected surface; introducing the gaseous precursor material at a predetermined concentration into the interior volume of the vessel at a pressure of up to 150 psia, wherein said material is remains chemically stable with said protected surface so as to not undergo substantial decomposition within the vessel.

In a second aspect, a pretreated pressure vessel prepared according to the process of: providing a pressure vessel and/or conduit extending therefrom having an interior volume defined by one or more surfaces; pretreating the one or more surfaces by applying an organic-containing material comprising a non-nitroso antioxidant, organosiloxane or combination thereof onto said one or more surfaces of the vessel; bonding said material onto said one or more surfaces in a manner sufficient to substantially delay onset of a metal forming film, said film formation resulting from decomposition of a gaseous precursor material introduced into said pressure vessel.

In a third aspect, a pretreated pressure vessel is provided, comprising a pressure vessel and/or conduit extending therefrom having an interior volume defined by one or more surfaces; the one or more surfaces protected with an organic-containing material to form a passivated region, said material comprising a non-nitroso antioxidant, organosiloxane, stabilizing agent or combination thereof; wherein bonding said material onto said one or more surfaces is in a manner sufficient to substantially delay onset of a metal forming film, said film formation resulting from decomposition of a gaseous precursor material introduced into said pressure vessel.

Advantageously, the present invention can be constructed utilizing system materials and components that are commercially available, thus enabling and simplifying the overall assembly of the system and method of use thereof.

BRIEF DESCRIPTION OF THE DRAWINGS

The objectives and advantages of the invention will be better understood from the following detailed description of the preferred embodiments thereof in connection with the accompanying figures wherein like numbers denote same features throughout and wherein.

DETAILED DESCRIPTION OF THE INVENTION

Figure 1:
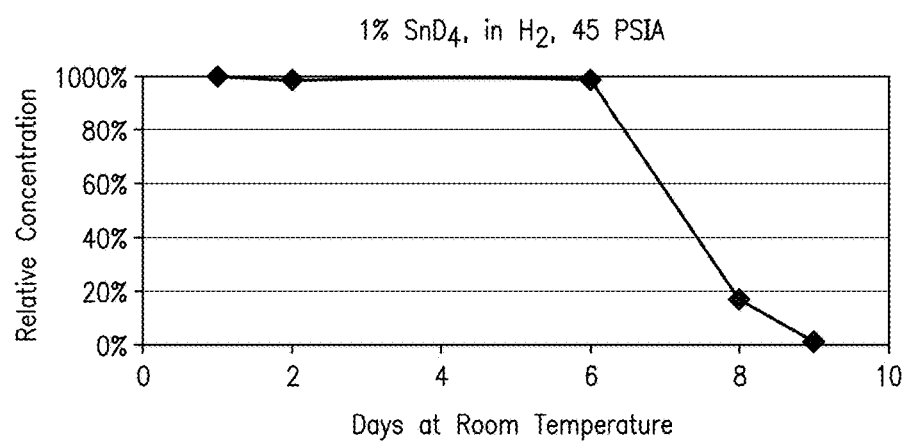
FIG. 1 shows the stability of $SnD_4$ at RT in an untreated 1 L aluminum (Al) cylinder, whereby an induction period indicates stability for 6 days, followed by rapid decomposition over 2 days.

The above and other features of the invention including various details of construction and combinations of parts, and other advantages, will now be more particularly described with reference to the accompanying disclosure and pointed out in the claims. The detailed description contemplates the features, aspects and embodiments to be described below in various permutations and combinations, as being within the scope of the disclosure. The disclosure may therefore be specified as comprising, consisting or consisting essentially of, any of such combinations and permutations of these specific features, aspects, and embodiments, or a selected one or ones thereof.

It will be understood that the particular pretreated pressure vessels and method of manufacturing embodying the invention are shown by way of illustration and not intended as a limitation of the invention. The principles and features of this invention may be employed in various and numerous embodiments without departing from the scope of the invention.

As used herein, all concentrations are expressed as volumetric percentages. The term "stable" as used herein means that the precursor material stored in a vessel does not undergo decomposition during storage therein and can be subsequently withdrawn and delivered for its downstream application. Unless indicated otherwise, all testing was performed at room temperature of 70° F.

The present invention recognizes that selection of a Sn precursor for epitaxial deposition is governed by several requirements. For instance, adequate film growth rate below a deposition temperature of 300° C. is preferably required. Additionally, substantially no carbon or oxygen incorporation can generally be tolerated to produce an acceptable ultrapure film. It is also preferred that substantially no amounts of uncontrolled dopants (e.g., boron, phosphorus, arsenic) are incorporated into the film. Furthermore, semiconductor applications require the precursor to be sufficiently stabilized to allow global distribution and be in a form allowing its safe and reliable delivery to the deposition tool.

Given the above requirements, $SnD_4$ can be utilized as a suitable tin precursor for depositing high quality tin alloys where up to 15% Sn incorporation may be required. SnD4 is compositionally free of carbon, oxygen and halogens, thereby avoiding problems encountered as a result of introducing impurities.

Although SnD4 is a suitable tin precursor, there appears to be an induction period, after which tin hydride may autocatalyze. The autocatalysis of the material increases the rate of decomposition to a point where the material cannot be used for various applications, such as semiconductor manufacturing. The present invention has recognized that the interaction of the SnD4 gas molecules with a vessel or cylinder surface may generate decomposition. In particular, the interior surface of the aluminum cylinder is covered by a combination of either terminal hydroxyl bonds (—OH) or dangling oxygen radical bonds (—O.) from the alumina coating on any aluminum metal exposed to the atmosphere. Without being bound by any particular theory, one of two possible mechanisms, and possibly a combination of both mechanisms, may be responsible for the initial reaction of the $SnD_4$ with the cylinder wall to form a metallic tin coating—either a reaction of the tin hydride with the free hydroxyls of the aluminum oxide coating or a radical bond cleavage reaction with the available oxygen radicals on the interior surface as shown below.

In accordance with principles of the present invention, the passivation and/or coating techniques have been developed in an effort to prevent both possible decomposition mechanisms. In such a manner, the passivation and/or coating can keep the SnD4 gas away from contact with the cylinder surface. In this manner, surface hydroxyls extending from the interior walls of a cylinder (e.g., aluminum cylinder) are blocked from being exposed to react with SnD4 and forming a tin metallic film which is then subject to further autocatalysis. By blocking the polar metallic surface of the cylinder with an organic, non-polar surface, the present invention offers a unique means to retard the formation of a catalytic metal tin film, as shown below.

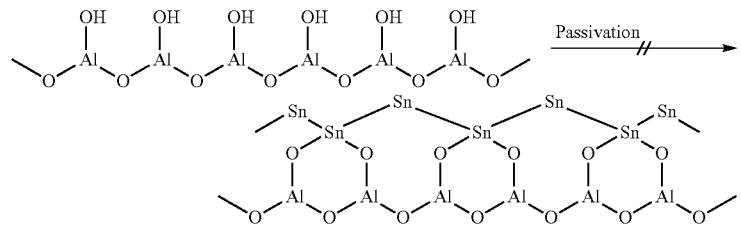

The present invention offers means to stabilize the SnD4 during storage, delivery and transport. In one embodiment of the present invention, a novel method for pretreating a pressure vessel to maintain storage of SnD4 in a stabilized form within the vessel is provided. An organic-containing material pressure vessel and optional conduit or tubing extending therefrom having an interior volume defined by one or more surfaces is pretreated by applying an organic-containing material onto the one or more surfaces of the vessel and/or conduit. The pretreatment forms a protected surface, thereby allowing the introduction of SnD4 at a predetermined concentration into the interior volume of the vessel at a pressure of up to 150 psia. The material remains chemically stable with said protected surface so as to not undergo substantial decomposition within the vessel composition.

In a preferred embodiment, the prevention of the reaction between tin hydride and the aluminum surfaces of the vessel may be accomplished by pre-reacting the surface first with an organosiloxane agent. In a preferred embodiment, the organosiloxane agent is ocadecyltrichlorosilane (OTS). OTS can react with the free hydroxyl bonds and generate a tight silicon organic coating which will both remove the reactive O—H bond and produce a physical barrier to prevent the subsequent approach of the tin hydride to the metal surfaces of the vessel. Without being bound by any particular theory, the mechanism for formation of the protected surface of the vessel utilizing OTS is shown below.

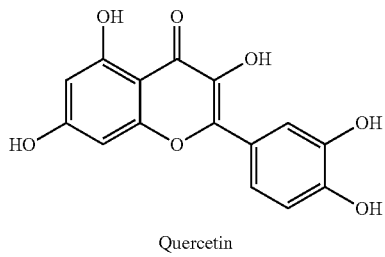 [SMILES: O=c1c(O)c(-c2ccc(O)c(O)c2)oc2cc(O)cc(O)c12]

Quercetin

Quercetin is a naturally occurring flavonoid antioxidant. Unlike OTS, quercetin does not bond, but rather, it may form a coating after the solvent is removed. Without being bound

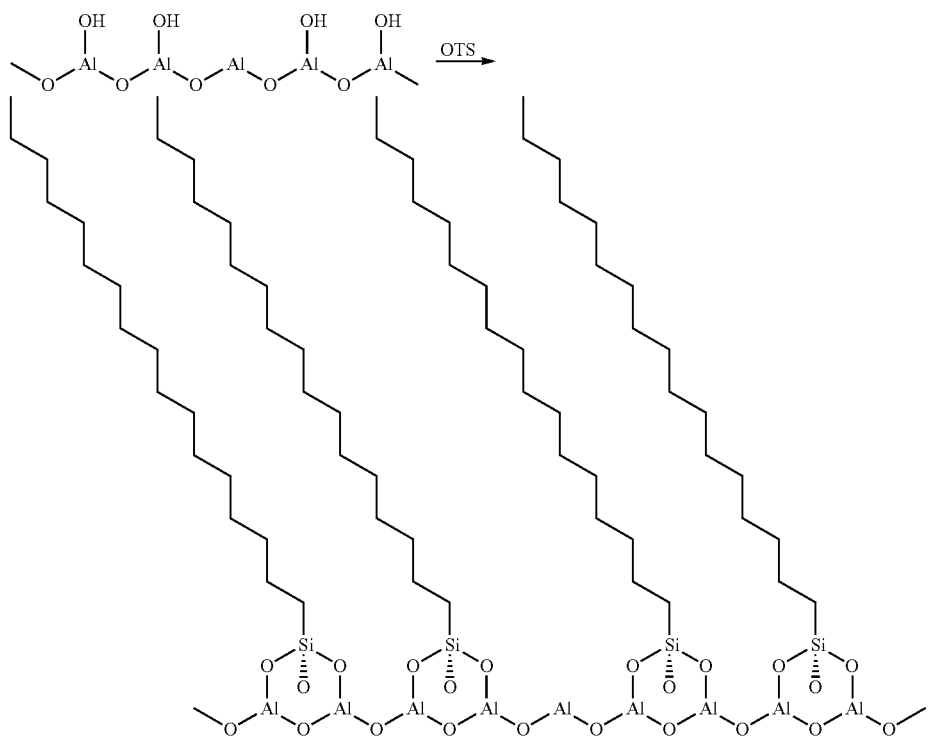

The passivating surface is represented by self assembled monolayers (SAMS) that are produced by OTS (octadecyltrichlorosilane). The SAMS form on the interior wall of an aluminum cylinder wall or surface. The SAMS are depicted on the right hand side of the above equation as a tight silicon organic coating that produces a physical barrier coating. The cylinder surface prior to SAM formation therealong is depicted by the hydroxyl bonds extending away from the surfaces (left hand side of above the reaction) The SAM is a preferred coating material for passivating the vessel surface, as it is permanently bonded to the surface and does not rinse out. Other commercially available organosiloxanes may be used and are contemplated by the present invention. In one example, the alkyl carbon chain of OTS may be shortened or lengthened.

In another preferred embodiment, the prevention of the reaction between tin hydride and the aluminum surfaces of the vessel may be accomplished by pre-reacting the vessel surface first with quercetin, shown below.

by any particular theory, there may be some hydrogen bonding between the polar surface of the vessel surface and the polar portions of the antioxidant. Not only can quercetin form a physical barrier on the surface, but its antioxidant capabilities may also deactivate the stable free radicals on the alumina surface. Other commercially available non-nitroso antioxidants may be used and are contemplated by the present invention. Still further, a combination of a non-nitroso antioxidant and organosiloxane can be used, such as for example, a mixture of quercetin and OTS in a predetermined ratio.

The concentration of SnD4 that can be stored in the vessel is in an amount which does not compromise the shelf life of the SnD4. In one embodiment, the concentration of the SnD4 in the vessel has a concentration of 2% or less. In another embodiment, the SnD4 is introduced into the pressure vessel at a concentration of 1% or less. In accordance with the principles of the present invention, greater than 2% SnD4 may be stored in a chemically stable form within the cylinder.

SnD4 is preferably maintained in a hydrogen-containing atmosphere within the pressure vessel to maintain chemical stability therein. In one embodiment, the pressure can reach up to about 150 PSIA. In another embodiment, the pressure can be maintained at 50-150 PSIA. In yet another embodiment, the vessel pressure is maintained at 50 PSIA or less.

In a preferred embodiment, 1% SnD4 in hydrogen is introduced into a pressure vessel that is pre-treated with quercetin and/or OTS. The pressure within the vessel can reach about 50 PSIA. In such a manner, quercetin and/or OTS can keep the SnD4 gas away from contact with the cylinder surface. The surface hydroxyls extending from the interior walls of a cylinder (e.g., aluminum cylinder) are blocked by quercetin and/or OTS, thereby delaying and/or preventing reaction of SnD4 stored within the passivated vessel with the vessel surfaces to form a tin metallic film which is then subject to further autocatalysis. By blocking the polar metallic surfaces of the cylinder with an organic, non-polar surface, the present invention offers a unique means for maintain chemical stability of the SnD4 for prolonged periods of time not previously possible utilizing conventional passivating techniques. The SnD4 remains chemically stable with the protected vessel surface so as to not decomposition therewithin.

Pretreatment of the vessels surfaces and/or conduit extending therefrom is preferably performed without removal of any residual oils, moisture and the like as typically contained on the surfaces of the vessels in the "as received condition." As demonstrated in the examples below, it has been surprisingly discovered that a pre-treatment of step of cleaning and drying prior to coating with OTS and/or quercetin actually reduces the shelf lifetime that SnD4 can maintained in a chemically stable form within the vessel.

The present invention also contemplates alternate passivation techniques. In one embodiment, plasticizers may be incorporated into surfaces of a vessel or conduit. Suitable plasticizers include dioctylphthlate (a common plasticizer of PVC) and dioctylterephthlate. Dioctylphthlate (DOP) is the dioctyl ester (2-ethylhexyl ester) of 1,2-benzenedicarboxylic acid. Without being bound by any particular theory, the ortho substitution of the carboxylates may generate a chelation zone to trap and hold the $SnD_4$ and isolate each molecule from each other. Dioctylterephthlate (DOT) is the para substituted version which lacks the intramolecular stabilization of inherent in DOP.

Various combinations of a non-nitroso antioxidant, organosiloxane and plasticizers may be utilized to create a pressure vessel with conduit capable of storing SnD4 without substantial decomposition. For example, a combination DOP, DOT, OTS and quercetin may be employed along various surfaces of a cylinder and corresponding conduit.

It should be understood that the principles of the present invention extend to the various materials besides SnD4 that may be prone to decomposition when in contact with vessel surfaces or conduit. Generally speaking, the passivating techniques of the present invention are applicable to any type of precursor material which is thermodynamically unstable, including, by way of example, SnH4, SiH4, Si2H6, B2H6 and GeH4.

Applicants have performed several experiments to compare the stability of SnD4 when utilizing several passivating techniques, as will now be discussed. In the Examples to be described below, the SnD4 was prepared following the procedure of Norman et al. (A. D. Norman, J. R. Webster, W. L. Jolly, *Inorganic Synthesis* 11, 170 (1968)), the contents of which are incorporated herein by reference in their entirety.

The only difference in synthesis being that that diglyme was substituted for diethyl ether. Anhydrous diglyme and tin chloride ($SnCl_4$) were purchased from Aldrich and used as is. Lithium aluminum deuteride ($LiAlD_4$) was purchased from Cambridge Isotope Laboratories, Inc. and used as is. All of the reactants were weighed in a nitrogen purged glovebox to minimize moisture contamination, which would contaminate the product with HCl. Typical yields for the reaction on a 5 g scale of $SnD_4$ were 50-75%. Analysis of the product was conducted using a Nicolet 760 FT-IR. As $SnD_4$ and $SnH_4$ are toxic materials, the waste gases from the process were scrubbed using a Novapure (CS Clean) hydride scrubber, and all hood flow air was scrubbed using a custom built CPL Carbon Link Corporation scrubber. All gas flows were monitored for the presence of hydrides in the lab air and in the hood exhaust using a MDA Scientific, Zellweger Analytics CM4 gas monitor.

Comparative Example 1

The concentration of $SnD_4$ of a 1% mixture with hydrogen ($H_2$) in a 1 L aluminum gas cylinder at 45 PSIA was measured by FT-IR to remain unchanged for 6 days at room temperature. Subsequently, the material was completely decomposed within 2 days, as shown in FIG. 1. The cylinder was purged and devalved. Inspection of the cylinder revealed a thin coating of tin metal on the walls with no particles or flaking. The metal was observed to be tightly adhered to the wall.

Comparative Example 2

Aluminum cylinders were cleaned and dryed to evaluate the impact the removal of residual cutting oils and moisture would have on the stability of SnD4 to be introduced thereafter. The cylinders were cleaned with three rinses each of acetone followed by cyclohexane. After blow drying with nitrogen they were assembled, leak checked and vacuum-purge dried over three days at 110° C. using ultra dry (UD) nitrogen. Having cleaned the surfaces of the cylinders, a 1% mixture of $SnD_4$ in hydrogen was filled therein to a pressure of 50 PSIA. This was accomplished by cryo trapping approximately 25 torr of freshly prepared $SnD_4$ from a 1 liter (L) intermediate flask into a 1 L Al cylinder at liquid nitrogen (LN2) temperatures (−196° C.). Hydrogen was added at LN2 temperatures and the cylinder pressure was recorded the next day after warming to RT overnight. These cleaned and dried cylinders produced a very short 2 day life. The results were surprising as the cleaner the cylinders, the shorter the $SnD_4$ lifetime.

Comparative Example 3

1 L Aluminum cylinders in the as-received condition were also evaluated to determine shelf life of SnD4. The as-received cylinders contained cutting oils and moisture distributed along the interior surfaces of the cylinders. Unlike Comparative Example 2, the surfaces were not cleaned and dried. A 1% mixture of $SnD_4$ in hydrogen was filled therein to a pressure of 50 PSIA. This was accomplished by cryo trapping approximately 25 torr of freshly prepared $SnD_4$ from a 1 liter (L) intermediate flask into a 1 L Al cylinder at liquid nitrogen (LN2) temperatures (−196° C.). Hydrogen was added at LN2 temperatures and the cylinder pressure of 50 PSIA was recorded the next day after warming to RT overnight.

The direct use of the cylinders as received and were surprised to find these had an average shelf lifetime or survival rate of about 30 days. SnD₄ was modestly stable in such "as received" cylinders. The results confirmed that the cleaner the cylinders, the shorter the SnD₄ lifetime.

Comparative Example 4

In an effort to deactivate the free radicals present on the surface, the cylinders were passivated with either 1% nitric oxide (NO) in nitrogen (room temperature for 3 days) or cylinders were rinsed with 1% isopropanol solutions of either TEMPO (2,2,6,6-tetramethyl-1-piperidinyloxy) or HTEMPO (4-hydroxy-2,2,6,6-tetramethyl-1-piperidinyloxy) solutions. Nitric oxide is known to exist as a stable free radical and we postulated that it would bond with the free radicals on the surface of the cylinder and deactivate them. Similarly, TEMPO and HTEMPO also contain stable free radicals and are more commonly used to stabilize butadiene against unwanted radical polymerization during storage and transport. The proposed passivation reaction mechanism is shown below.

The cylinders were cleaned and dried before treatment to eliminate the benefit of the "as received" coating of unknown materials (moisture, cutting oils, etc.). SnD4 was then introduced into the cylinders. The SnD4 concentration was 1% in hydrogen with a cylinder pressure of 50 PSIA.

Neither passivating techniques was successful; the NO treated cylinders lasted on average 9 days and the TEMPO or HTEMPO cylinders lasted on average 4 days.

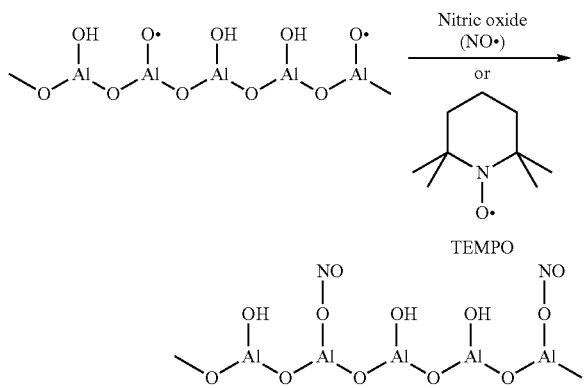

Proposed passivation of aluminum oxide coating by either NO or TEMPO. (Passivation shown only for NO)

Comparative Example 5

Higher concentrations and/or higher pressures of SnD4 storage within cylinders were evaluated. Quercetin-passivated cylinders lasted for 16 days with SnD₄ at 4% concentration (in H₂) and 50 PSIA and only 5 days at 150 PSIA. Similarly, a coating made with 2% Quercetin in THF protected 1% SnD₄ (in H₂ at 150 PSIA) for 42 days. OTS protected the cylinder from 4% SnD₄ in H₂ at 150 PSIA for only 7 days.

Example 1

A solution of OTS in toluene (0.04%) was prepared in a glovebox following the addition of a trace amount of water to the toluene (1.5 microL added to 1 L) before bringing the solvent into the glovebox. A small amount of water was necessary to achieve a uniform coating coverage and cross-link the siloxanes onto the surface. The solution was poured into the cylinder and the valve hand tightened. The cylinder was inverted overnight and then righted for two days at RT. The cylinder was removed from the glovebox and rinsed three times with 50 mL of toluene followed by three times with cyclohexane. The cylinder was then reassembled, leak tested and dried under vacuum overnight. SnD4 was then prepared and 1% SnD4 in H2 was introduced (in a manner as previously described) into the OTS-passivated cylinders at a pressure of 50 PSIA.

It was observed that OTS protected the SnD4 from decomposition for approximately 8 months at room temperature. The cylinders are continuing to remain passivated and are being sampled monthly.

Example 2

Figure 2:
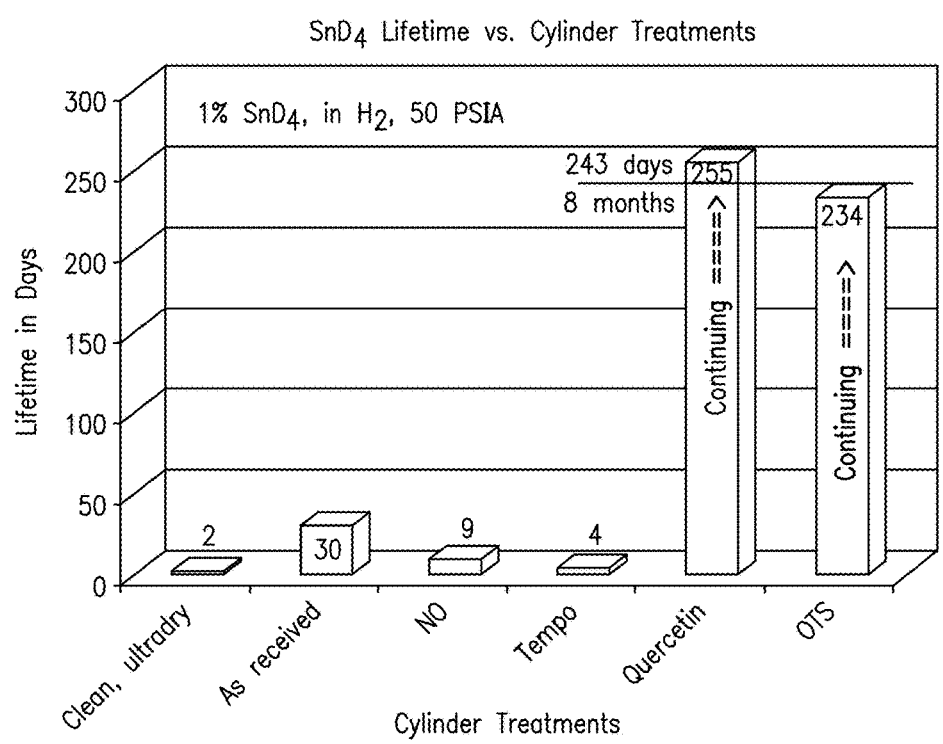
FIG. 2 shows the lifetime in days of SnD4 in Al cylinders subject to various passivating techniques and no passivation.

Quercetin was utilized to passivate surfaces of the aluminum cylinders. Quercetin coated cylinders (0.3% in ethanol, soaked overnight) were not rinsed, but rather they were drained and dried under vacuum overnight. _. SnD4 was then prepared and 1% SnD4 in H2 was introduced (in a manner as previously described) into the OTS-passivated cylinders at a pressure of 50 PSIA. It was observed that quercetin protected the SnD4 from decomposition for approximately 8 months at room temperature. The cylinders are continuing to remain passivated and are being sampled monthly. A summary of the lifetime in days of SnD4 is shown in FIG. 2. All tests were performed with a concentration of SnD4 of 1% in H2 with a cylinder pressure of 50 PSIA.

Example 3

Figure 3:
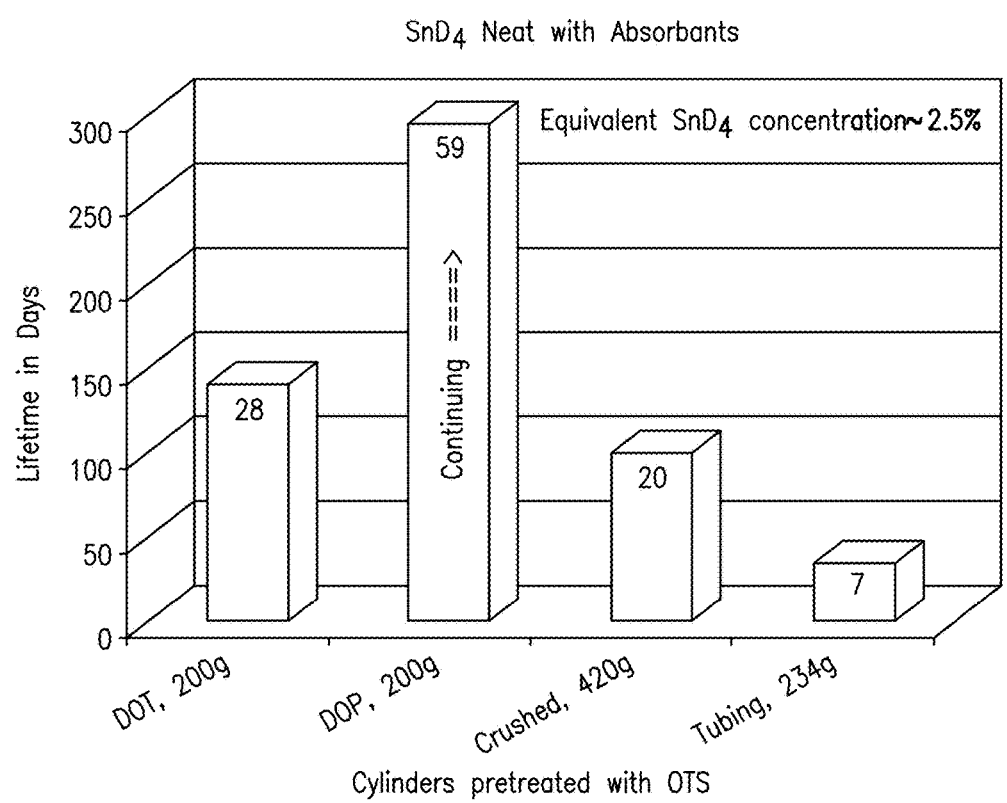
FIG. 3 shows stability of $SnD_4$ to room temperature storage using plasticizers such as dioctylphthlate (DOP) and dioctylterephthlate (DOT)

Alternative stabilizers reagents were evaluated using plasticizers. During the many synthesis runs to prepare SnD₄, an unusual and resilient concentration of SnD₄ was observed in the PVC tubing, suggesting the SnD4 gas may be "dissolving" in the plasticizer in the PVC based polymer. The gas molecules were dissolved into just the plasticizer and/or pieces of the tubing itself. This was accomplished with the use of inexpensive plasticizers such as dioctylphthlate (a common plasticizer of PVC) and dioctylterephthlate. Pieces of tubing as well as lengths of tubing placed inside the cylinders were evaluated prior to filling with SnD4. The cylinders were pretreated with OTS to prevent the vapor phase portion of the gas from decomposing. Comparison of these plasticizers was performed. FIG. 3 shows evaluated samples of "crushed" PVC tubing as well as 8 inch lengths. The weights listed are of the additives and SnD₄. DOT sample lasted about 28 days, while the DOP sample remains active. It also shows that the higher surface area of the crushed sample was more effective than the pieces of tubing. Some difference may be due to the different weights, but the 3× lifetime of the crushed sample seems to outweigh the 1.8× weight difference. Slight vapor pressure was detected in each of the samples.

Example 4

Figure 4:
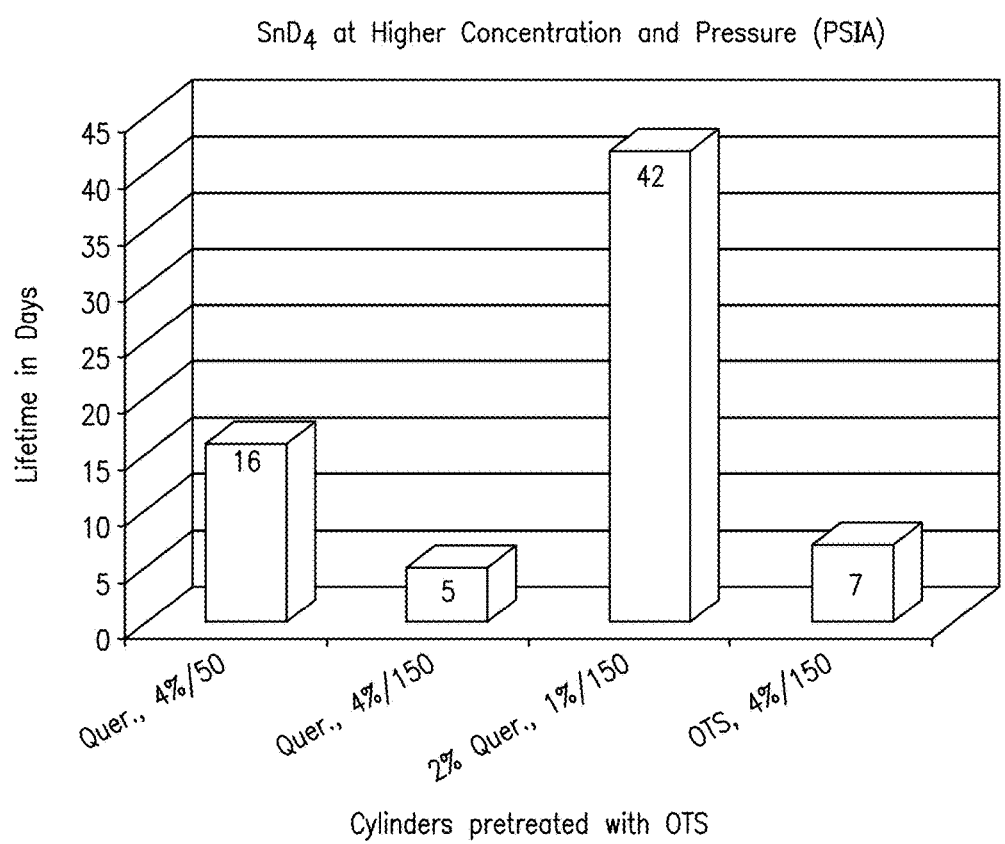
FIG. 4 shows lifetime of $SnD_4$ at higher pressures and concentrations utilizing a cylinder passivated with OTS or quercetin.

Having identified OTS and quercetin as viable stabilizing reagents, higher pressures and/or higher concentrations of SnD4 storage with the OTS and quercetin passivated cylinders were evaluated. Results are shown in FIG. 4. FIG. 4 shows that a vessel pretreated with a 2% quercetin solution in THF allowed a 1% SnD4 at 150 PSIA within the vessel to remain stable and not decompose for 42 days. In contrast, a quercetin passivated cylinder had a shelf life for only 16 days with $SnD_4$ at 4% concentration (in $H_2$) and 50 PSIA and only 5 days at 150 PSIA. OTS protected the cylinder from 4% $SnD_4$ in $H_2$ at 150 PSIA for only 7 days.

While it has been shown and described what is considered to be certain embodiments of the invention, it will, of course, be understood that various modifications and changes in form or detail can readily be made without departing from the spirit and scope of the invention. It is, therefore, intended that this invention not be limited to the exact form and detail herein shown and described, nor to anything less than the whole of the invention herein disclosed and hereinafter claimed.

The invention claimed is:

1. A pretreated pressure vessel prepared according to the process of:
    providing a pressure vessel and/or conduit extending therefrom having an interior volume defined by one or more surfaces;
    pretreating the one or more surfaces by applying an organic-containing material comprising a non-nitroso antioxidant, onto said one or more surfaces of the vessel, wherein said non-nitroso antioxidant comprises quercetin;
    bonding said organic-containing material onto said one or more surfaces in a manner sufficient to delay onset of a metal forming film, said film formation resulting from decomposition of a gaseous precursor material introduced into said pressure vessel.

2. The pretreated pressure vessel prepared according to claim 1, wherein said vessel is substantially devoid of oxygen impurities.

3. The pretreated pressure vessel prepared according to claim 1, wherein said surfaces are not pre-cleaned or pre-dried prior to said pretreating the one or more surfaces.

4. The pretreated pressure vessel prepared according to claim 1, further comprising storage of said gaseous precursor material at a predetermined concentration into the interior volume of the vessel at a pressure of up to 150 psia, wherein said gaseous precursor material remains chemically stable so as to not undergo substantial decomposition within the vessel.

5. The pretreated pressure vessel of claim 1, further comprising a gaseous precursor material.

6. The pretreated pressure vessel of claim 5, wherein said gaseous precursor material is selected from the group consisting of $SnD_4$, $SnH_4$, $SiH_4$, $Si_2H_6$, $B_2H_6$ and $GeH_4$.

7. A pretreated pressure vessel, comprising;
    a pressure vessel and/or conduit extending therefrom having an interior volume defined by one or more surfaces;
    the one or more surfaces protected with an organic-containing material to form a passivated region, said material comprising a non-nitroso antioxidant, organosiloxane, stabilizing agent or combination thereof;
    wherein bonding said material onto said one or more surfaces is in a manner sufficient to delay onset of a metal forming film, said film formation resulting from decomposition of a gaseous precursor material introduced into said pressure vessel; and
    a gaseous precursor material disposed within the interior volume of the pretreated pressure vessel;
    said pretreated pressure vessel comprising $SnD_4$, wherein said gaseous precursor material is $SnD_4$ stored within said vessel at 70° F. and up to 50 psia, and said organic-containing material is selected from the group consisting of quercetin, ocadecyltrichlorosilane (OTS) and combinations thereof, said $SnD_4$ remaining chemically stable with said passivated region so as to not undergo substantial decomposition within the vessel for at least 200 days.

8. A pretreated pressure vessel, comprising:
    a pressure vessel and/or conduit extending therefrom having an interior volume defined by one or more surfaces;
    the one or more surfaces protected with an organic-containing material to form a passivated region, said material comprising a non-nitroso antioxidant, organosiloxane, stabilizing agent or combination thereof;
    wherein bonding said material onto said one or more surfaces is in a manner sufficient to delay onset of a metal forming film, said film formation resulting from decomposition of a gaseous precursor material introduced into said pressure vessel; and
    a gaseous precursor material disposed within the interior volume of the pretreated pressure vessel, said precursor material comprises $SnD_4$;
    said pretreated pressure vessel comprising $SnD_4$, wherein said gaseous precursor material is $SnD_4$ stored within said vessel at 70° F., and said organic-containing materials is a stabilizing agent selected from the group consisting of dioctylphthlate (DOP), dioctylterephthlate (DOT) or combinations thereof, said $SnD_4$ remaining chemically stable with said passivated region so as to not undergo substantial decomposition within the vessel for at least 20 days.

* * * * *

UNITED STATES PATENT AND TRADEMARK OFFICE
CERTIFICATE OF CORRECTION

PATENT NO. : 9,829,152 B2  
APPLICATION NO. : 13/918564  
DATED : November 28, 2017  
INVENTOR(S) : Ronald F. Spohn et al.

It is certified that error appears in the above-identified patent and that said Letters Patent is hereby corrected as shown below:

On the Title Page

Item (73) the Assignee information listed "Praxxair Technology, Inc." is in error. The assignee information should read as follows: --Praxair Technology, Inc.--.

Signed and Sealed this  
Fifth Day of June, 2018

Andrei Iancu  
*Director of the United States Patent and Trademark Office*